United States Patent [19]
Gorham et al.

[11] Patent Number: 6,157,221
[45] Date of Patent: Dec. 5, 2000

[54] THREE INPUT COMPARATOR

[75] Inventors: Kenneth Duane Gorham, Palatine; Daniel Joseph Blase, Algonquin, both of Ill.

[73] Assignee: Northrop Grumman Corporation, Los Angeles, Calif.

[21] Appl. No.: 09/273,581

[22] Filed: Mar. 23, 1999

[51] Int. Cl.[7] .................................................. H03K 5/52
[52] U.S. Cl. ............................. 327/75; 327/65; 327/66; 327/74; 327/89; 327/71
[58] Field of Search ................................. 327/65, 67, 74, 327/75, 76, 77, 66, 89, 205, 206, 71, 50, 63

[56] References Cited

U.S. PATENT DOCUMENTS

| | | | |
|---|---|---|---|
| 3,555,290 | 1/1971 | Ellermeyer | 327/526 |
| 4,061,932 | 12/1977 | Cordell | 327/74 |
| 4,069,432 | 1/1978 | Bazin | 327/74 |
| 4,149,160 | 4/1979 | Bozarth et al. | 340/661 |
| 4,177,394 | 12/1979 | Takasugi | 327/71 |
| 4,590,391 | 5/1986 | Valley | 327/74 |
| 4,647,796 | 3/1987 | Necoechea | 327/74 |
| 5,049,761 | 9/1991 | Zitta | 327/172 |
| 5,115,151 | 5/1992 | Hull et al. | 327/65 |
| 5,302,869 | 4/1994 | Hosotani et al. | 327/75 |
| 5,373,400 | 12/1994 | Kovacs | 360/46 |
| 5,394,251 | 2/1995 | Widigen et al. | 364/786 |
| 5,436,582 | 7/1995 | Ikeda | 327/65 |
| 5,459,465 | 10/1995 | Kagey | 341/156 |
| 5,541,538 | 7/1996 | Bacrania et al. | 327/77 |
| 5,801,553 | 9/1998 | Danstrom | 327/67 |
| 5,963,062 | 10/1999 | Fujii | 327/74 |

*Primary Examiner*—Dinh T. Le
*Assistant Examiner*—Hiep Nguyen
*Attorney, Agent, or Firm*—Terry J. Anderson; Karl J. Hoch, Jr.

[57] ABSTRACT

A three input comparator facilitates the comparison of a signal to the greater of two different reference voltages in a manner which mitigates propagation delay. A first differential pair of transistors facilitates comparison of the two reference voltages to one another, while second and third differential pairs of transistors facilitate comparison of the signal to the higher of the two reference voltages.

4 Claims, 2 Drawing Sheets

| CONDITION | OUTPOS | OUTNEG |
|---|---|---|
| S > T1 > T2 | HIGH | LOW |
| S > T2 > T1 | HIGH | LOW |
| T1 > S > T2 | LOW | HIGH |
| T2 > S > T1 | LOW | HIGH |
| T1 > T2 > S | LOW | HIGH |
| T2 > T1 > S | LOW | HIGH |

THREE INPUT COMPARATOR

FIELD OF THE INVENTION

The present invention relates generally to comparator circuitry and more particularly to a three-input comparator for comparing a signal to the greater of two reference voltages and for providing an output indicative of whether or not the signal is higher than both of the reference voltages.

BACKGROUND OF THE INVENTION

Comparators for comparing two analog signals to one another and for indicating which of the two analog signals is the higher one are well known. One common circuit utilized to effect such comparison is the differential amplifier, which provides a positive output when one of the two signals is higher and a negative output when the other of the two signals is higher.

Typically, one of the inputs to the differential amplifier will be a reference voltage. The other input comprises a signal which is compared to the reference voltage, so as to obtain an indication as to which of the two inputs to the differential amplifier is higher.

Dedicated comparators, which are specifically designed to operate under open loop conditions and to function as switching devices, are also known. Such dedicated comparators function in a manner very similar to an open loop operational amplifier. One advantage of using such a dedicated comparator is that it frequently has a much faster response time than an operational amplifier which is used as a comparator.

Comparators have many different applications. They're commonly utilized in pulse generators, square-wave generators, triangular-wave generators, pulse-width modulators, level detectors, zero-crossing detectors, pulse generators, line receivers, limit comparators, voltage-controlled oscillators, A/D converters, and time delay generators, for example.

An important characteristic of a comparator is the response time or propagation delay introduced thereby. This is defined as the time between the input voltage transition and some specified point on the output voltage transition. Response times for contemporary voltage comparators generally range from about 1 µs down to about 10 ns.

As those skilled in the art will appreciate, it is sometimes desirable to compare a signal to the higher of two different reference voltages. It is certainly possible to construct a three input comparator circuit using a plurality of contemporary comparators or the like. This may be accomplished simply by using a first comparator to compare the two reference voltages to determine which is the higher one thereof, then switching the highest reference voltage to the second comparator to compare the highest reference voltage to the signal. Alternatively, a signal can be compared to one reference voltage on a first comparator while simultaneously comparing the same signal to a second reference voltage on a second comparator, then applying logic gates to determine whether or not the signal is greater than both reference voltages.

However, to do so with contemporary devices inherently results in at least a doubling of the propagation delay. In some applications, such a propagation delay is not desirable.

In view of the foregoing, it is desirable to provide a three input comparator for comparing a signal to the greater of two reference voltages, wherein the three input comparator mitigates propagation delay and thus is suitable for use in applications requiring a fast response time.

SUMMARY OF THE INVENTION

The present invention specifically addresses and alleviates the above mentioned deficiencies associated with the prior art. More particularly, the present invention generally comprises a three input comparator for comparing a signal to the greater of two reference voltages.

According to the preferred embodiment of the present invention, the three input comparator comprises a first differential pair of transistors configured to receive first and second reference voltages and to cause current to flow through a dedicated one of the first pair of transistors when an amplitude of the first reference voltage is greater than an amplitude of the second reference voltage and to cause current to flow through the other one of the first differential pair of transistors when the amplitude of the second reference voltage is greater than the amplitude of the first reference voltage. The one of the first differential pair of transistors having current flowing therethrough is representative of which of the first and second reference voltages has the greatest amplitude.

Thus, when the first differential pair of transistors has the first and second reference voltages applied thereto and the first reference voltage is applied to a first one of the first and second transistors thereof, then the first transistor may be caused to conduct so as to indicate that the first reference voltage is higher than the second reference voltage. Alternatively, application of the higher reference voltage to the first transistor may cause it to cease conducting and cause the other transistor of the differential pair to conduct, similarly providing an indication that the first reference voltage is higher than the second reference voltage. Which transistor conducts is merely a matter of design choice.

In a similar manner, a second differential pair of transistors is configured to receive the first reference voltage and the signal and to cause current to flow through a dedicated one of the second differential pair of transistors when an amplitude of the signal is greater than the amplitude of the first reference voltage and to cause current to flow through the other one of the second differential pair of transistors when the amplitude of the first reference voltage is greater than the amplitude of the signal. The one of the first pair of transistors having current flowing therethrough is again representative of which of the first reference voltage and the signal has the greatest amplitude. As with the first differential pair of transistors, either transistor may be caused to conduct in response to a given signal having the greatest voltage.

A first current mirror circuit is configured to cause current to flow through the second differential pair of transistors when the first reference voltage is greater than the second reference voltage. In this manner, that particular reference voltage which is the higher of the two is caused to be compared to the signal.

Similarly, a third differential pair of transistors is configured to receive the second reference voltage and the signal and to cause current to flow through a dedicated one of the second pair of transistors when the amplitude of the signal is greater than the amplitude of the second reference voltage and to cause current to flow through the other one of the third pair of transistors when the amplitude of the second reference voltage is greater than the amplitude of the signal. The one of the second pair of transistors having current flowing therethrough is representative of which of the second reference voltage and the signal has the greatest amplitude.

A second current mirror circuit is configured to cause current to flow through the third differential pair of transistors when the second reference voltage is greater than the first reference voltage.

The signal being greater than both the first and second reference voltages causes a unique indication thereof. Similarly, one of the first and second reference voltages being greater than the signal causes a different unique indication thereof. In this manner, an electrical signal representative of the outcome of the two comparisons is provided in a manner which mitigates propagation delay.

According to the preferred embodiment of the present invention, the first, second, and third pairs of differential transistors comprise first, second, and third pairs of transistors. The pairs of transistors of the first, second, and third pairs of differential switches are preferably configured such that when one of the transistors conducts, the other one thereof substantially ceases conducting. According to the preferred embodiment of the present invention, this is provided by utilizing a current limited source such that when one of the transistors of the differential pair of switches conducts, then it draws substantially all of the current, i.e., loads down, the current source such that substantially no current is available to flow through the other transistor of the differential pair of switches.

If NPN transistors are used, the transistor which has the highest level signal on it will conduct the most, such that it draws substantially all of the current from the current limited current source. Alternatively, if PNP transistors are used the transistor with the highest signal on it may be caused to cease conducting, thereby causing the other transistor of the differential pair of switches to conduct substantially all of the current from the current limited current source. Again, this is merely a matter of design choice.

An indicator circuit provides one state, i.e., a high output, as an indication that the signal is higher than both of the reference voltages, for example, and provides another state, e.g., a low state, to indicate that at least one of the reference voltages is higher than the signal.

These, as well as other advantages of the present invention will be more apparent from the following description and the drawings. It is understood that changes in the specific structure shown and described may be made within the scope of the claims without departing from the spirit of the invention.

DETAILED DESCRIPTION OF THE PREFERRED EMBODIMENT

The detailed description set forth below in connection with the appended drawing is intended as a description of the presently preferred embodiment of the invention, and is not intended to represent the only form in which the present invention may be constructed or utilized. The description sets for the function and the sequence of steps for constructing and using the invention in connection with the illustrated embodiment. It is to be understood, however, that the same or equivalent functions may be accomplished by different embodiments that are also intended to be encompassed within the spirit and scope of the invention.

Figures 1, 3:
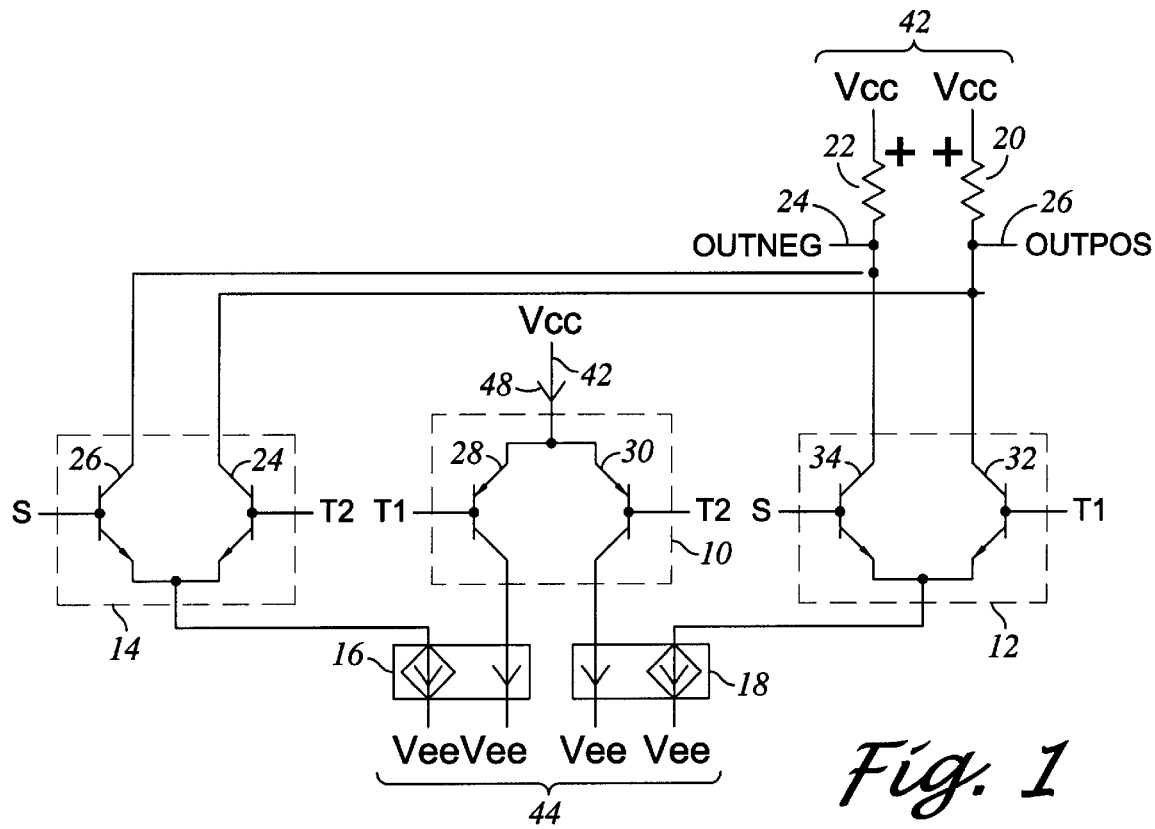
FIG. 1 is a simplified schematic of the three input comparator of the present invention.
FIG. 3 is a chart showing the output indications of the three input comparator of the present invention for six possible conditions of inputs thereto.
Figure 2:
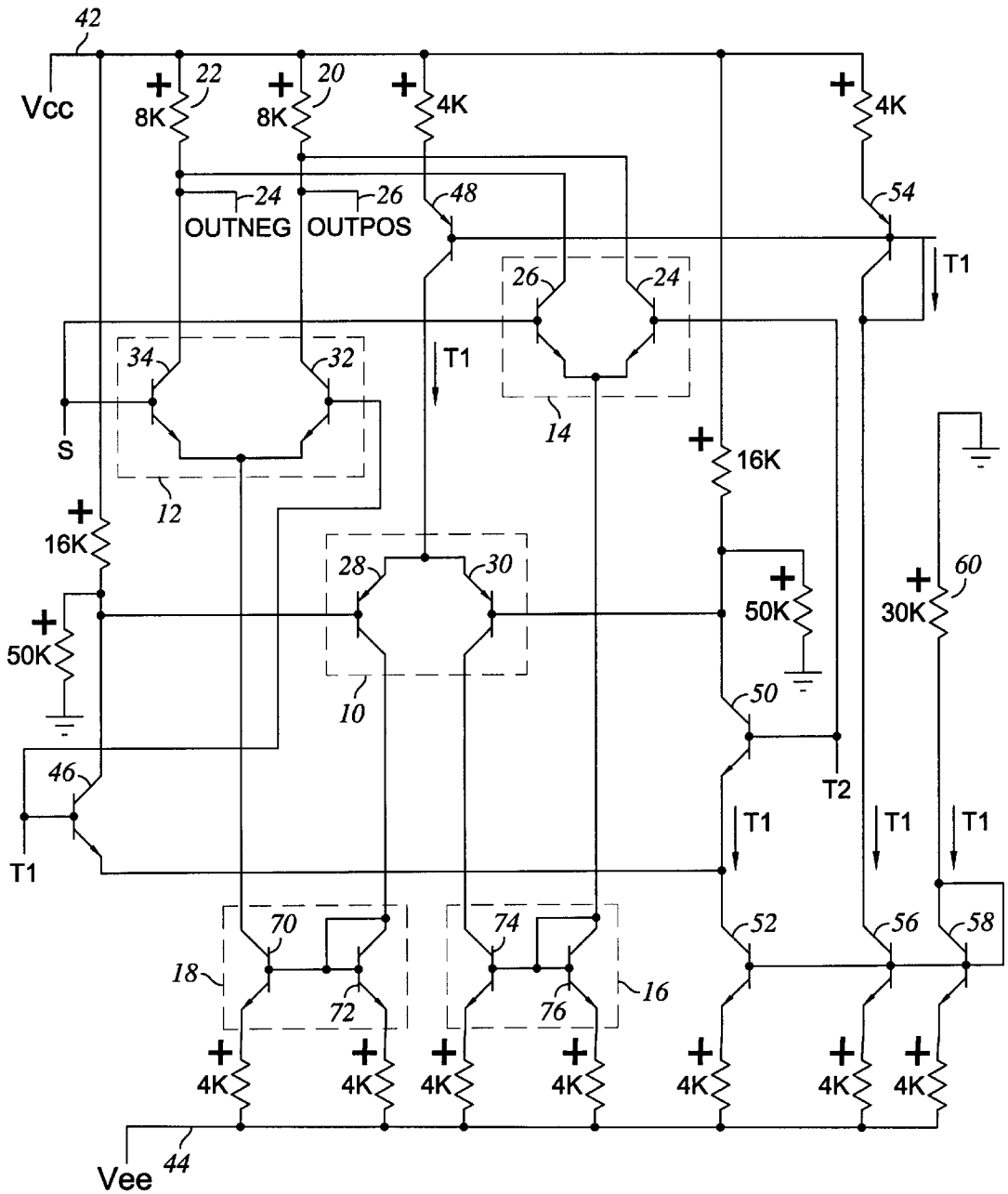
FIG. 2 is a more detailed schematic of the three input comparator of the present invention.

The three input comparator of the present invention is illustrated in FIGS. 1 through 3 which depict a presently preferred embodiment thereof.

Referring now to FIG. 1, the present invention generally comprises a first differential pair of transistors 10 which effectively function to compare the two reference voltages T1 and T2 to one another; a second differential pair of transistors 12 which effectively function to compare the first reference voltage T1 to the signal S; and a third differential pair of transistors 14 which effectively functions to compare the signal S to the second reference voltage T2.

There are two regions of operation for the 3 input comparator, one when the reference voltages T1 and T2 are within approximately 0.1 volts of each other, and another when there is a larger difference between T1 and T2. In the first region of operation (T1 nearly equal to T2), differential pair 10 will steer the bias current proportionally to differential pairs 12 and 14. If T1 is equal to T2, then equal bias current will be supplied to the differential pairs 12 and 14. If T1 is slightly greater than T2, then more bias current will be steered to differential pair 12 and less current to differential pair 14. When T1 is more than 0.1 volt greater than T2, all of the bias current will be steered through differential pair 12 and no bias current will be supplied to differential pair 14. This arrangement allows for a smooth transition from the region where T1 and T2 are nearly equal and the region where T1 and T2 differ by more than 0.1 volt.

As discussed in detail below, the signal S is only compared to the higher of the two reference voltages T1 and T2. Thus, either the second differential pair of transistors 12 or the third differential pair of transistors 14 will be utilized in a particular comparison, but not both.

According to the preferred embodiment of the present invention, the first differential pair of transistors 10 comprises transistors 28 and 30 which accept the first reference voltage T1 and the second reference voltage T2 upon the bases thereof.

In a similar manner, the second differential pair of transistors 12 comprises transistors 32 and 34 which accept T1 and TS as inputs to the bases thereof and the third differential pair of transistors 14 comprises transistors 24 and 26 which accept input T2 and S to the bases thereof.

Current mirror 18 causes the same current to flow through the second differential pair of transistors 12 as flows through transistor 30 of the first differential pair of transistors 10. A second current mirror 16 similarly causes the same amount of current to flow through the third differential pair of transistors 14 as flows through transistor 28 of the first differential pair of transistors 10.

Voltage source 42 provides positive operating voltage to the transistors 24, 26, 28, 30, 32, and 34. $V_{ee}$ provide the negative operating voltage for transistors 24, 26, 28, 30, 32, and 34.

OUTPOS 26 provides a positive output or high level when the signal is determined to have a higher amplitude than both of the reference voltage and provides a negative or low level output otherwise. OUTNEG 24 provides the opposite signal of OUTPOS 26. This is discussed in detail in conjunction with FIG. 3 below. Resistors 20 and 22 provide voltage drops to cause OUTPOS 26 and OUTNEG 24 to have the desired level as a result of the three input comparison.

Thus, in operation the signal S is applied to the base of transistor 26 and to the base of transistor 34. T1 is applied to the base of transistor 28 and to the base of transistor 32. T2 is applied to the base of transistor 24 and to the base of transistor 30.

The first differential pair of transistors 10 compares T1 to T2. Since transistors 28 and 30 are PNP transistors, increasing the positive voltage on the base thereof tends to cause them to conduct less. Thus, if T1 is higher than T2, then transistor 30 will conduct more than transistor 28.

Continuing to assume that T1 is greater than T2, and that transistor 30 conducts more than transistor 28, substantially all of the current supplied by current source 48 to the first differential pair of transistors 10 flows through transistor 30. Current mirror 18 then causes an equal amount of current to flow through the second differential pair of transistors 12. At the second differential pair of transistors 12, S is compared to T1 (since T1 is the higher of T1 and T2). Since transistors 32 and 34 are NPN transistors, the highest positive signal of S and T1 will cause its corresponding transistor 34 or 32, respectively, to conduct more. Again, almost all of the current provided to the second differential pair of transistors 12 flows through the transistor 32, or 34 whichever conducts the most. Assuming that S is greater than T1, then transistor 34 will conduct more than transistor 32.

Since little current flows through resistor 20, OUTPOS remains at a high or positive level, thereby indicating that S is higher than both T1 and T2.

Of course, the third differential pair of transistors 14 operates in a manner analogous to that of the second pair of differential transistors 12.

Referring now to FIG. 2, a more detailed schematic of the three input comparator of the present invention is provided. Again, the first differential pair of transistors comprises transistors 28 and 30, the second differential pair of transistors 12 comprises transistors 32 and 34, and the third differential pair of transistors 14 comprises transistors 24 and 26. Resistors 20 and 22 again provide the voltage drops necessary to provide the desired output at OUTNEG 24 and OUTPOS 26.

Transistor 58 sets a current reference $I_1$ $(0-V_{EE}-VBE58)$/(resistance of resistor 60+resistances of resistor 62).

Transistor 56 is a current source tied to reference transistor 58, such that transistor 56 has collector current=$I_1$.

Transistor 52 is a current source tied to reference transistor 58 and therefore has collector current=$I_1$. Transistor 52 is the current source for the differential pair formed by transistor 46 and transistor 50.

Transistor 48 and transistor 54 define a current mirror. The current $I_1$ from transistor 56 is reflected through transistor 54 and current source transistor 48. Transistor 48 is the current source for the differential pair comprising transistor 30 and transistor 28.

Transistor 46 and transistor 50 form a differential pair with reference signals T1 and T2 as inputs. This differential pair amplifies the difference between T1 and T2, with the result feeding the differential pair comprises of transistor 30 and transistor 28. Differential pair of transistors 30, 28 then steers the current $I_1$ (from transistor 48) through current mirrors (transistors 70, 72 and transistors 74, 76) to the differential pairs of transistors 32, 34 and transistors 26, 24. The addition of the transistors 46, 50 pair before the transistor pair 30, 28 increases the gain and reduces the region where both differential transistor pairs 32, 34 and 24, 26 are active.

First current mirror 18 and second current mirror 16 each comprise a pair of transistors configured to have a common input to the bases thereof, so as to assure substantially equal current flow therethrough.

Referring now to FIG. 3, a chart is provided which indicates the output for each of six different states of inputs. For example, the first line indicates that when S is greater than T1 which is greater than T2, then OUTPOS is high and OUTNEG is low. Similarly, when T1 is greater than S which is greater than T2, then OUTPOS is low and OUTNEG is high, while when T1 is greater than T2 which is greater than S, then OUTPOS is low and OUTNEG is high.

Thus, according to the present invention, propagation delay is mitigated in a three input comparator which provides an output indicative of whether or not the input signal is higher than both of the reference signals.

It is understood that the exemplary three input comparator described herein and shown in the drawings represents only a presently preferred embodiment of the invention. Indeed, various modifications and additions may be made to such embodiment without departing from the spirit and scope of the invention. For example, various different types of transistors may be utilized to effect the three different comparisons of the first, second, and third differential pairs. Also, various methodologies for facilitating current mirroring are contemplated. Thus, these and other modifications and additions may be obvious to those skilled in the art and may be implemented to adapt the present invention for use in a variety of different applications.

What is claimed is:

1. A three input comparator for comparing a signal to first and second reference voltages to provide first and second voltage indicating signals at a differential output, the three input comparator comprising:

a) a first differential pair of transistors configured to receive first and second reference voltages and to cause a first current to flow through one of the first differential pair of transistors when an amplitude of the first reference voltage is greater than an amplitude of the second reference voltage and to cause a second current to flow through the other one of the first differential pair of transistors when the amplitude of the second reference voltage is greater than the amplitude of the first reference voltage;

b) a second differential pair of transistors configured to receive the first reference voltage and the signal and to cause a third current to flow through one of the second differential pair of transistors when an amplitude of the signal is greater than the amplitude of first reference voltage and to cause a fourth current to flow through the other one of the second differential pair of transistors when the amplitude of the first reference voltage is greater than the amplitude of the signal, the one of the first pair of transistors having the third current flowing through the differential output being representative of which of the first reference voltage and the signal has the greatest amplitude;

c) a first current mirror circuit coupled to said first differential pair of transistors and said second pair of transistors to cause said second current flow through the second differential pair of transistors when the first reference voltage is greater than the second reference voltage; and d) a third differential pair of transistors configured to receive the second reference voltage and the signal and to cause a fifth current to flow through one of the second pair of transistors when the amplitude of the signal is greater than the amplitude of the second reference voltage and then to cause a sixth current to flow through the other one of the third pair of transistors when the amplitude of the second reference voltage is greater than the amplitude of the signal, the one of the second pair of transistors having said fifth current flowing to the differential output being representative of which of the second reference voltage and the signal has the greatest amplitude;

e) a second current mirror circuit coupled to said first differential pair of transistors and said third pair of transistors configured to cause the fifth current to flow through the third differential pair of transistors when the second reference voltage is greater than the first reference voltage;

f) wherein the amplitude of the signal being greater than the amplitude of the first and second reference voltages, the voltage indicating signal is generated thereof and one of the first and second reference voltages being greater than the signal causes a different unique indication thereof.

2. The three input comparator as recited in claim 1, wherein the first, second, and third pairs of differential transistors comprise first, second, and third pairs of transistors.

3. The three input comparator as recited in claim 1, wherein the first, second, and third differential pairs of transistors comprise pairs of transistors configured such that when current flows through one of the transistors, then current flow through the other transistor is substantially zero.

4. The three input comparator as recited in claim 2, further comprising a common current limited current source for each of the first, second, and third pairs of differential transistors, the current limited source being configured such that only the switch with the greatest conduction conducts substantially, current flow through the other transistor being substantially zero.

* * * * *

UNITED STATES PATENT AND TRADEMARK OFFICE
CERTIFICATE OF CORRECTION

PATENT NO. : 6,157,221
DATED : December 5, 2000
INVENTOR(S) : Kenneth Duane Gorham and Daniel Joseph Blase It is certified that error appears in the above-identified patent and that said Letters Patent is hereby corrected as shown below:

STATEMENT OF GOVERNMENT RIGHTS

This invention was made with Government Support under contract F33657-90-C-2254 awarded by the United States Air Force. The Government has certain rights in this invention.

Signed and Sealed this

Nineteenth Day of March, 2002

Attest:

Attesting Officer

JAMES E. ROGAN
Director of the United States Patent and Trademark Office